(12) United States Patent
Shin et al.

(10) Patent No.: US 11,101,223 B2
(45) Date of Patent: Aug. 24, 2021

(54) DISPLAY DEVICE

(71) Applicant: Samsung Display Co., LTD., Yongin-si (KR)

(72) Inventors: Dong Hee Shin, Asan-si (KR); Yoo Mi Ra, Ansan-si (KR); Geun Ho Lee, Hwaseong-si (KR); Yong Hee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/932,807

(22) Filed: Jul. 19, 2020

(65) Prior Publication Data

US 2021/0151384 A1    May 20, 2021

(30) Foreign Application Priority Data

Nov. 14, 2019 (KR) .................. 10-2019-0145889

(51) Int. Cl.
*H01L 23/544* (2006.01)
*G02F 1/1362* (2006.01)
*G02F 1/1333* (2006.01)
*G02F 1/1368* (2006.01)
*H01L 27/12* (2006.01)
*G02F 1/1339* (2006.01)

(52) U.S. Cl.
CPC .......... *H01L 23/544* (2013.01); *G02F 1/1368* (2013.01); *G02F 1/13394* (2013.01); *G02F 1/133354* (2021.01); *G02F 1/136286* (2013.01); *H01L 27/1214* (2013.01); *G02F 1/136222* (2021.01); *H01L 2223/54426* (2013.01)

(58) Field of Classification Search
None
See application file for complete search history.

(56) References Cited

U.S. PATENT DOCUMENTS 7,848,594 B2    12/2010 Yoshikawa
2019/0219868 A1*    7/2019 Hui .................. G02F 1/136286

FOREIGN PATENT DOCUMENTS

| KR | 10-2005-0060669 | 6/2005 |
| KR | 10-1070202 | 10/2011 |
| KR | 10-1581083 | 12/2015 |
| KR | 10-2016-0026683 | 3/2016 |

* cited by examiner

*Primary Examiner* — Richard H Kim
(74) *Attorney, Agent, or Firm* — H.C. Park & Associates, PLC

(57) ABSTRACT

According to an aspect of the invention, a display device includes: a first substrate; and a plurality of pixels including a first pixel disposed in the first substrate. The first pixel includes: a first transistor; a first electrode connected with the first transistor; a first color filter having a color and overlapping the first electrode connected with the first transistor; and a third measurement indicia having a color and overlapping the first color filter, and the first color filter has a color different from the color of the third measurement indicia.

19 Claims, 10 Drawing Sheets

DISPLAY DEVICE

CROSS-REFERENCE TO RELATED APPLICATION

This application claims priority from and the benefit of Korean Patent Application No. 10-2019-0145889 filed on Nov. 14, 2019, which is hereby incorporated by reference for all purposes as if fully set forth herein.

BACKGROUND

Field

Exemplary implementations of the invention relate generally to a display device, and, more specifically, to a display device including indicia to measure alignment errors in a mask during manufacture of the display device.

Discussion of the Background

A flat panel display device, which is currently known, includes a liquid crystal displays (LCD), a light emitting display device, and the like.

Various patterns are formed during a manufacturing process of such a flat panel display device, and an exposure device is used to form the patterns. The exposure device exposes an object according to a pattern formed in a pattern mask.

However, as the display device has increased in size, there is a problem in exposing the display substrate at one time with a pattern mask because of the size limitation of the pattern mask. Accordingly, a method for sequentially aligning a plurality of smaller pattern masks on the display panel for exposure is used.

The above information disclosed in this Background section is only for understanding of the background of the inventive concepts, and, therefore, it may contain information that does not constitute prior art.

SUMMARY

Applicant realized that image distortion may occur at a boundary of the respective pattern masks when sequentially aligning them during manufacture of display devices and specifically discovered that an alignment pattern located outside the display area cannot accurately measure distortion of the masks.

Display devices constructed according to the principles and exemplary implementations of the invention reduce image distortion at a boundary of the respective pattern masks by measuring an alignment error of a mask occurring during a manufacturing process of the display device. For example, whenever multiple masks are used to manufacture a display device, the alignment error may be accurately measured and compensated for by positioning indicia, such as alignment patterns within the display area.

Additional features of the inventive concepts will be set forth in the description which follows, and in part will be apparent from the description, or may be learned by practice of the inventive concepts.

According to an aspect of the invention, a display device includes: a first substrate; and a plurality of pixels including a first pixel disposed in the first substrate. The first pixel includes: a first transistor; a first electrode connected with the first transistor; a first color filter having a color and overlapping the first electrode connected with the first transistor; and a third measurement indicia having a color and overlapping the first color filter, and the first color filter has a color different from the color of the third measurement indicia.

The plurality of pixels may further include a second pixel and a third pixel, the second pixel includes: a second transistor; a first electrode connected with the second transistor; a second color filter having a color and overlapping the first electrode connected with the second transistor; and a first measurement indicia overlapping the second color filter, the first indicia having a different color from the color of the second color filter, and the third pixel includes: a third transistor; a first electrode connected with the third transistor; a third color filter having a color and overlapping the first electrode connected with the third transistor; and a second measurement indicia overlapping the third color filter, the second measurement indicia having a different color from the color of the third color filter.

The first color filter and the first measurement indicia may have the same color due to being formed through the same process, the second color filter and the second measurement indicia may have the same color due to being formed through the same process, and the third color filter and the third measurement pattern may have the same color due to being formed through the same process.

The first, second and third measurement indicia may include first, second and third measurement patterns, respectively, and the color of the first color filter and the first measurement pattern may be red, the color of the second color filter and the second measurement pattern may be green, and the color of the third color filter and the third measurement pattern may be blue.

The first substrate may include n areas partitioned by (n-1) virtual boundary lines, and, the first pixel, the second pixel, and the third pixel may be located at opposite edges of the virtual boundary lines.

The plurality of pixels may further include a fourth pixel that is not adjacent to the virtual boundary line, the fourth pixel may include: a fourth transistor; a first electrode connected with the fourth transistor; a color filter overlapping the first electrode connected with the fourth transistor; and a sub-column spacer overlapping the fourth transistor.

The display device may further include: a second substrate overlapping the first substrate; a second electrode disposed on the second substrate; and a liquid crystal layer disposed between the first substrate and the second substrate. The liquid crystal layer in the first pixel may have a first thickness and the liquid crystal layer in the fourth may have a second thickness, and the difference between the first thickness and the second thickness may be less than about 10%.

The third measurement indicia may be disposed on the first color filter, the first measurement indicia may be disposed below the second color filter, and the second measurement indicia may be disposed below the third color filter.

The third measurement indicia may be formed a substantially quadrangular shape.

The first pixel may include a gate line including first and second gate lines spaced apart from each other and a gate electrode connecting to the first and second gate lines. The third measurement indicia may overlap the gate electrode.

According to another aspect of the invention, a display device includes: a first substrate including n areas partitioned by (n-1) virtual boundary lines; and a plurality of pixels disposed on the first substrate. The plurality of pixels includes a first pixel located adjacent to the virtual boundary line. The first pixel includes: a first transistor; a first electrode connected with the first transistor; a color filter having a color and overlapping the first electrode connected with the first transistor; and a measurement indicia having a color and overlapping the color filter. The colors of the color filter and the measurement indicia are one of red, green, and blue, and the color filter and are different from each other.

n may be a natural number from 2 to 10.

The measurement indicia may include a measurement pattern located on or below the color filter.

The first pixel may include a gate line including first and second gate lines spaced apart from each other and a gate electrode connecting to the first gate second gate lines, and the measurement indicia may overlap the gate electrode.

The measurement indicia may have a substantially quadrangular shape.

The plurality of pixels may further include a second pixel that is not adjacent to the virtual boundary line, the second pixel includes: a second transistor; a first electrode connected with the second transistor; a color filter overlapping the first electrode connected with the second transistor; and a sub-column spacer overlapping the second transistor.

The sub-column spacer may have a first thickness and the measurement indicia may have a second thickness, and the difference between the first thickness and the second thickness may be less than about 10%.

According to still another aspect of the invention, a display device includes: a first substrate; and a plurality of pixels disposed on the first substrate. The plurality of pixels include a first pixel, a second pixel, and a third pixel, the first pixel includes: a first transistor; a first electrode connected with the first transistor; a first color filter overlapping the first electrode connected with the first transistor; and a second indicia overlapping the first color filter, the second pixel includes: a second transistor; a first electrode connected with the second transistor; a second color filter overlapping the first electrode connected with the second transistor; and a third measurement indicia overlapping the second color filter, and the third pixel includes: a third transistor; a first electrode connected with the third transistor; a third color filter overlapping the first electrode connected with the third transistor; and a first measurement indicia overlapping the third color filter.

The first, second and third measurement indicia may include first, second and third measurement patterns, respectively, and first color filter and the first measurement pattern may be red, the second color filter and the second measurement pattern may be green, and the third color filter and the third measurement pattern may be blue.

The first measurement indicia may be located below the third color filter, the second measurement indicia may be located on the first color filter, and the third measurement indicia may be located on the second color filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
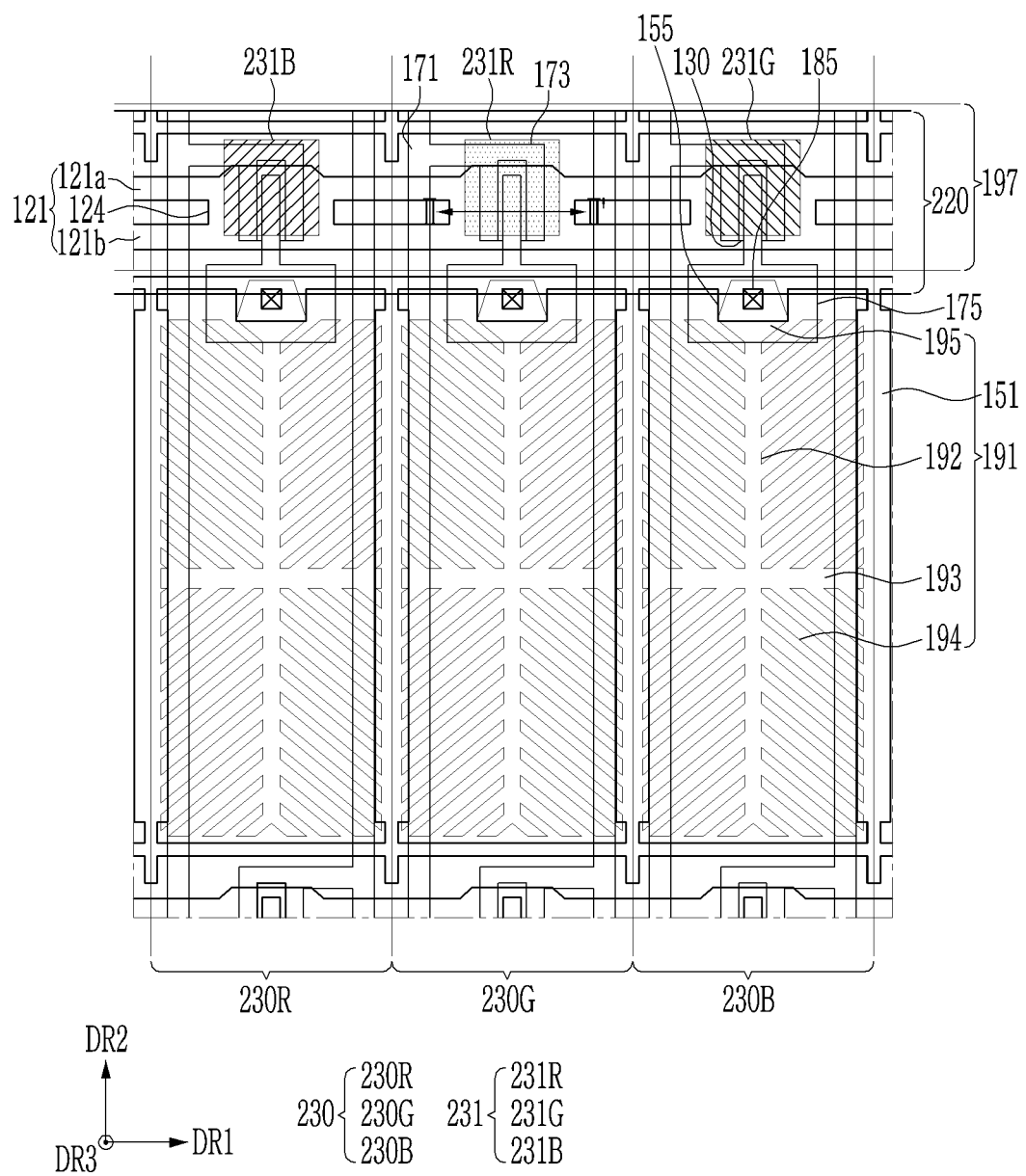
FIG. 1 is a layout view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
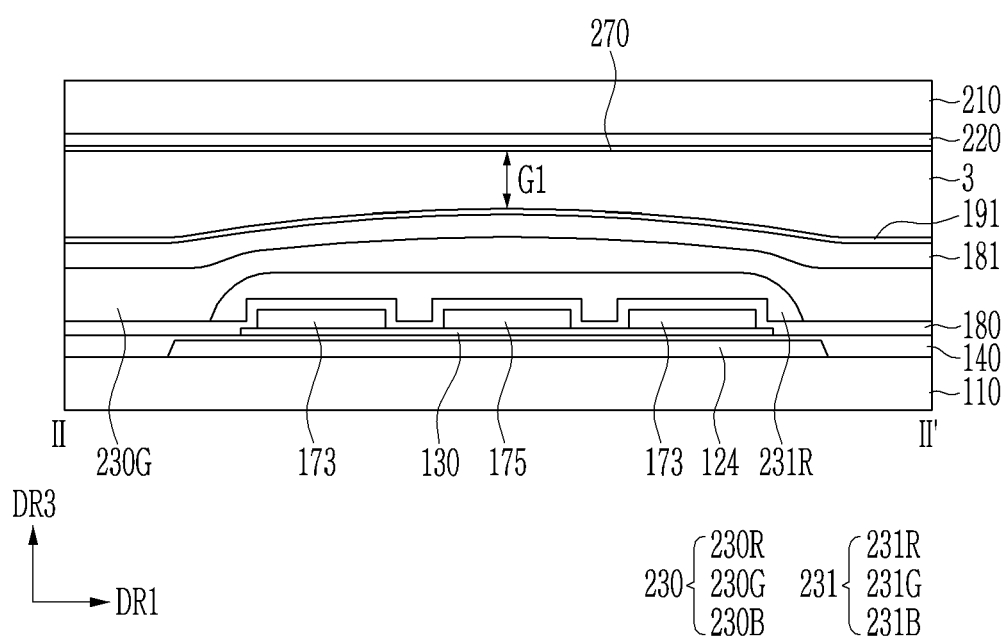
FIG. 2 is a cross-sectional view taken along the line II-II' of the display device of FIG. 1.

FIG. 1 is a layout view of an exemplary embodiment of a display device constructed according to the principles of the invention. FIG. 2 is a cross-sectional view taken along the line II-II' of the display device of FIG. 1.

FIG. 1 is a layout view of three pixels, each emitting a different color. In an exemplary embodiment, each pixel refers to an area that includes a transistor and a first electrode 191 connected with the transistor, and represents one color. In FIG. 1, three pixels respectively representing red, green, and blue are illustrated. For example, three R, G, B pixels which located adjacent each other may constitute a single pixel unit to produce a desired color.

Referring to FIG. 1, gate lines 121 are disposed along a first direction DR1 on a first substrate 110. The gate lines 121 may include a first gate line 121a and a second gate line 121b, which are separated from each other, and a gate electrode 124 that connects the first gate line 121a and the second gate line 121b as shown in FIG. 1.

Referring to FIG. 1, a storage electrode line 151 is disposed on the same layer as the gate line 121. The storage electrode line 151 is located along the first direction DR1 and a second direction DR2, and may be formed surrounding the edge of one pixel. The storage electrode line 151 may include an expansion portion 155 having a larger area than other portions, and the expansion portion 155 may overlap a drain electrode 175. The gate line 121 and the storage electrode line 151 may be formed through the same process and may include the same material.

Referring to FIG. 2, a gate insulating layer 140 is disposed on the gate electrode 124, gate line 121 of FIG. 1 and the storage electrode line 151 of FIG. 1. The gate insulating layer 140 may include a silicon oxide or a silicon nitride. The gate insulating layer 140 may have a multilayer structure including at least two insulation layers, each having a different physical property.

Next, a semiconductor layer 130 is disposed on the gate insulating layer 140. The semiconductor layer 130 may be disposed to overlap the gate electrode 124 as shown in FIG. 2.

Next, a data line 171, a source electrode 173, and the drain electrode 175 are disposed on the semiconductor layer 130 and the gate insulating layer 140. The source electrode 173 and the drain electrode 175 are connected to the data line 171 as shown in FIG. 1.

The data line 171 which transmits a data signal to the pixel may extend in the second direction DR2 such that it crosses the gate line 121 as shown in FIG. 1. For example, the source electrode 173 may extend from the data line 171 and thus may overlap the gate electrode 124, and may be substantially formed in the shape of a "U".

Referring to FIG. 1, two data lines 171 may be located at opposite sides of one pixel. Pixels that are disposed in parallel with each other in the second direction DR2 may be connected with different data lines 171.

For example, the drain electrode 175 may be separated from the data line 171 and may extend upward from a center of the U-shaped source electrode 173. A part of the drain electrode 175 may overlap the expansion portion 155 of the storage electrode line 151.

A single transistor may be formed by the gate electrode 124, the source electrode 173, the drain electrode 175, and the semiconductor layer 130. The channel region of the transistor may be formed in the semiconductor layer 130 between the source electrode 173 and the drain electrode 175.

Next, referring to FIG. 2, an insulation layer 180 is disposed on the source electrode 173, the drain electrode and the data line 171 of FIG. 1. The insulation layer 180 may be omitted depending on exemplary embodiments.

A plurality of color filters 230 (230R, 230G, and 230B) are disposed on the insulation layer 180. The color filters 230 may include red color filters 230R, green color filters 230G, and blue color filters 230B. Referring to FIG. 1, the red color filter 230R, the green color filter 230G, and the blue color filter 230B are disposed substantially in parallel with each other along the second direction DR2.

Referring to FIG. 1, indicia may be provided in the form of one or more measurement patterns, such as a red measurement pattern 231R, which is disposed below the green color filter 230G. The red measurement pattern 231R is spaced apart from the red color filter 230R, and may be formed in the shape of a quadrangle as shown in FIG. 1. Such a red measurement pattern 231R may overlap the green color filter 230G.

Likewise, a green measurement pattern 231G is disposed below the blue color filter 230B. The green measurement pattern 231G is spaced apart from the green color filter 230G, and may be formed in the shape of a quadrangle as shown in FIG. 1. Such a green measurement pattern 231G may overlap the blue color filter 230B.

A blue measurement pattern 231B may be disposed above the red color filter 230R. Such a measurement pattern 231 (231R, 231G, and 231B) is formed through the same process as the forming process of the color filter 230 (230R, 230G, and 230B), and thus may be used as a measurement means for alignment of a mask disposed when forming the color filters 230. The details of the alignment process will be described later.

That is, the red measurement pattern 231R is formed through the same process as the red color filter 230R, and the green measurement pattern 231G is formed through the same process as the green color filter 230G. Next, the blue measurement pattern 231B is formed through the same process as the blue color filter 230B.

Referring to FIG. 2, a protective layer 181 is disposed on the color filter 230 (e.g., green color filter 230G). The protective layer 181 may prevent material from the color filter 230 from permeating into a liquid crystal layer 3.

Referring to FIG. 2, a first electrode 191 is disposed on the protective layer 181. The first electrode 191 is connected with the drain electrode 175 through a contact hole 185 of FIG. 1 formed in the insulation layer 180, the color filter 230, and the protective layer 181 as shown in FIG. 1. The first electrode 191 may include a transparent conductor such as ITO or IZO. The first electrode 191 may be a pixel electrode.

For example, referring to FIG. 1, the first electrode 191 includes a horizontal stem portion 193 that is parallel with the first direction DR1, a vertical stem portion 192 that is parallel with the second direction DR2, and minute branch portions 194 extended from the horizontal stem portion 193, the vertical stem portion 192 in a diagonal direction, and a protruding portion 195 being connected with the drain electrode 175.

Referring to FIG. 1, a shield electrode 197 is disposed on the same layer as the first electrode 191. The shield electrode 197 may be located in the first direction DR1 and overlap the gate line 121 and the transistor.

The first electrode 191 and the shield electrode 197 may be formed through the same process and may include the same material.

Referring to FIG. 1 and FIG. 2, a light blocking member 220 is disposed on a second substrate 210 that faces the first substrate 110. The light blocking member 220 may be located in the first direction DR1 and overlap the gate line 121 and the transistor. For example, the light blocking member 220 may be located only in the first direction DR1 as shown in FIG. 1, but the light blocking member 220 may be located substantially in parallel with the second direction DR2.

Referring back to FIG. 2, a second electrode 270 is disposed on the light blocking member 220. The second electrode 270 may be a common electrode that receives a common voltage.

The liquid crystal layer 3 is disposed between the first electrode 191 and the second electrode 270.

As described, the display device constructed according to the principles of the invention includes the measurement pattern 231(231R, 231G, and 231B) that is formed through the same process as each color filter 230 (231R, 231G, and 231B). Such a measurement pattern 231 may be located only in some areas of the plurality of pixels disposed in the display device. For example, the measurement pattern 231 is located at an edge of an area corresponding to a single mask 700, and may be used to measure an alignment of masks 700 in a process for forming the color filter 230.

Figure 3:
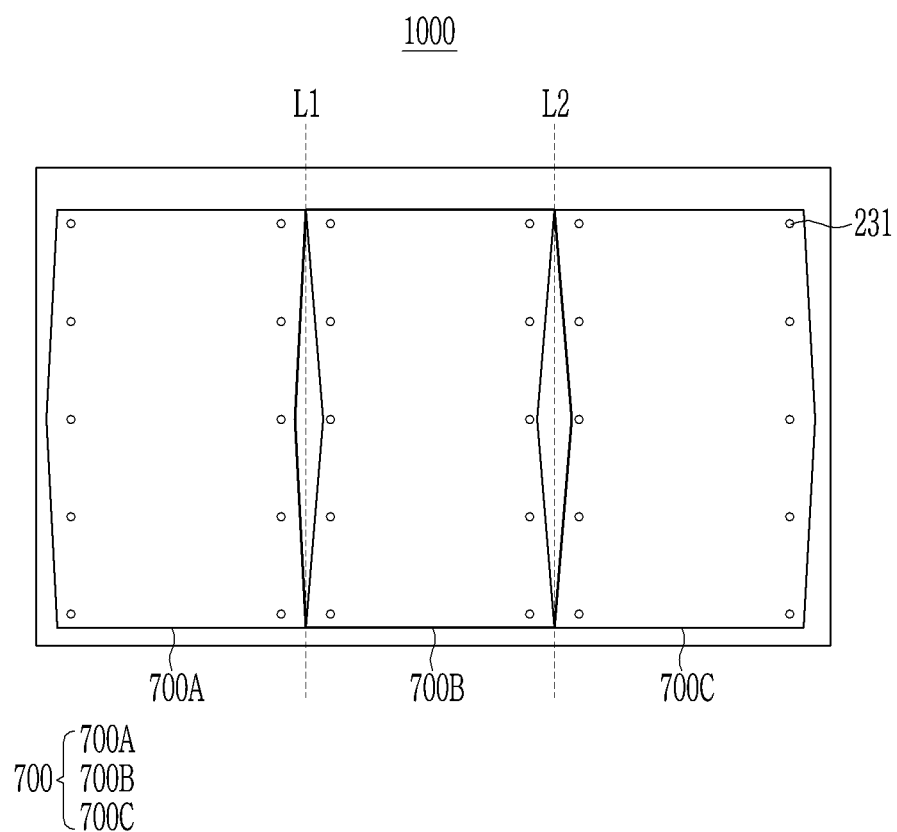
FIG. 3 is a plan view schematically illustrating a mask used in forming of a display panel in the display device constructed according to the principles of the invention.

FIG. 3 is a plan view schematically illustrating the mask used in forming of a display panel in the display device constructed according to the principles of the invention. Referring to FIG. 3, as the display device has been increased in size recently, a plurality of masks 700 (700A, 700B, and 700C) are used to manufacture one display panel 1000. In FIG. 3, three masks 700A, 700B, and 700C are used. The mask 700 shown in FIG. 3 may be a mask for forming the color filter 230. Although three masks are exemplarily illustrated in FIG. 3, the number of masks may be variously changed depending on exemplary embodiments. Moreover, exemplary embodiments of the invention are not limited to any particular size of display device, but may be useful anytime multiple masks are employed to make a display.

When multiple masks are used image distortion may occur at a boundary of adjacent masks 700. The distortion is caused by use of a proxy exposer. In FIG. 3, distortion of the mask 700 is illustrated. On order to correct the distortion, the degree of distortion occurring at the boundary of the masks 700 needs to be accurately measured and reversely compensated. In this case, the degree of distortion may vary from the edge of the display panel 1000 toward the center, and thus the measurement pattern should be located inside the display area of the display panel 1000 for accurate distortion measurement. An alignment pattern located outside the display area cannot accurately measure distortion of the mask 700.

In the display device constructed according to the principles of the invention, the measurement pattern 231 is located at a boundary area of the masks 700 in the display area. The measurement pattern 231 is formed through the same process as the color filter 230 to measure a degree of distortion of the mask 700 through location measurement of the measurement pattern 231.

The measurement pattern 231 may be located in a pixel that is located at an edge of a single mask 700. That is, the measurement pattern 231 is not disposed in every pixel, but is located only in a pixel adjacent to an edge of the mask 700 used in a manufacturing process of the color filter 230.

In FIG. 3, boundary lines L1 and L2 of the masks 700 are illustrated. Pixels located at both of the opposite sides of the boundary lines L1 and L2 are formed by using different masks 700. Referring to FIG. 3, the measurement pattern 231 may be located at the periphery of the boundary lines L1 and L2.

Figure 4:
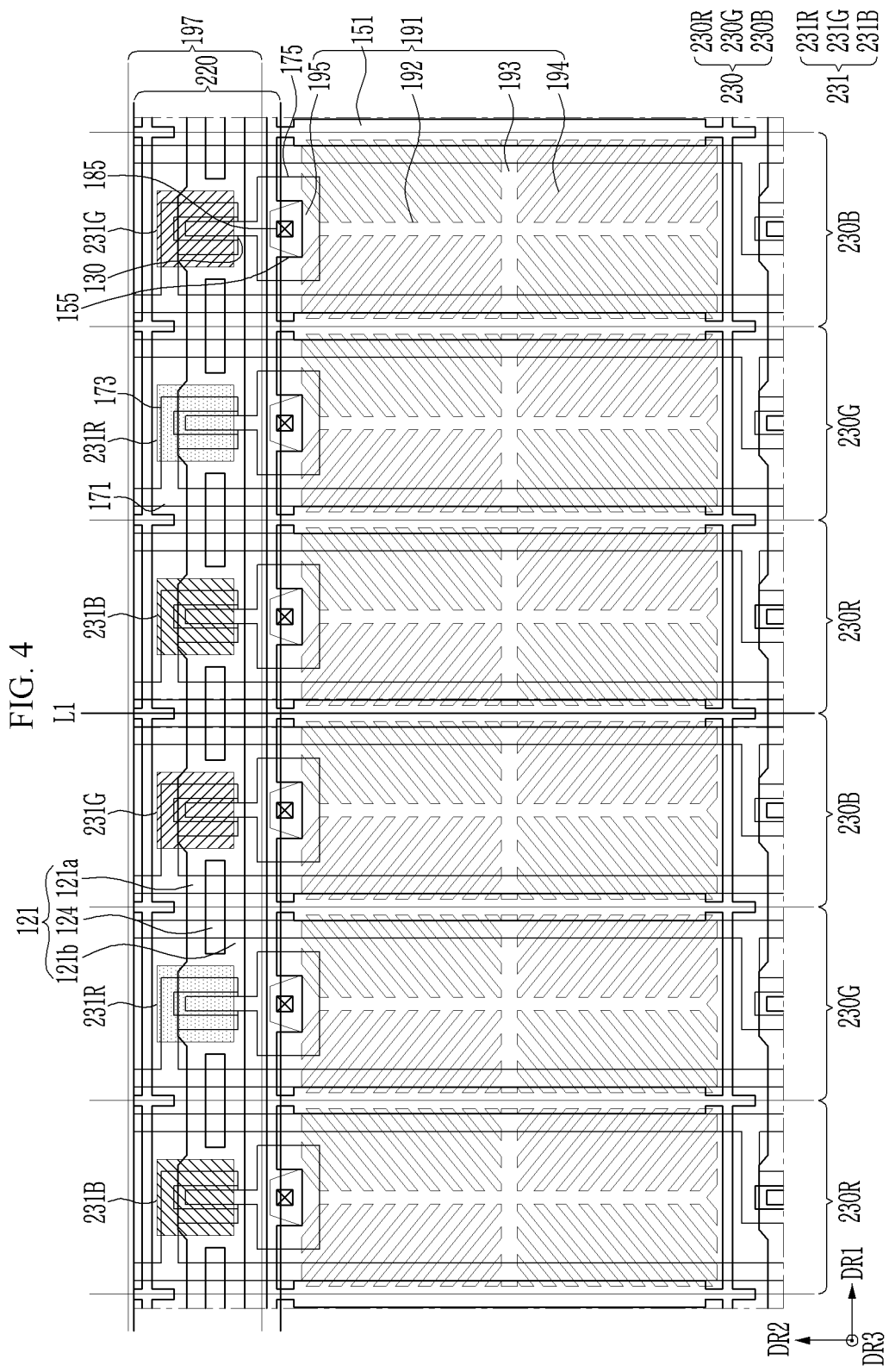
FIG. 4 illustrates six representative pixels located at opposite sides of the boundary line L1 of FIG. 3.

FIG. 4 illustrates six representative pixels located at opposite sides of the boundary line L1 of FIG. 3. As shown in FIG. 4, the measurement patterns 231R, 231G, and 231B are disposed at each of the pixels located at opposite sides of the boundary line L1.

Figure 5:
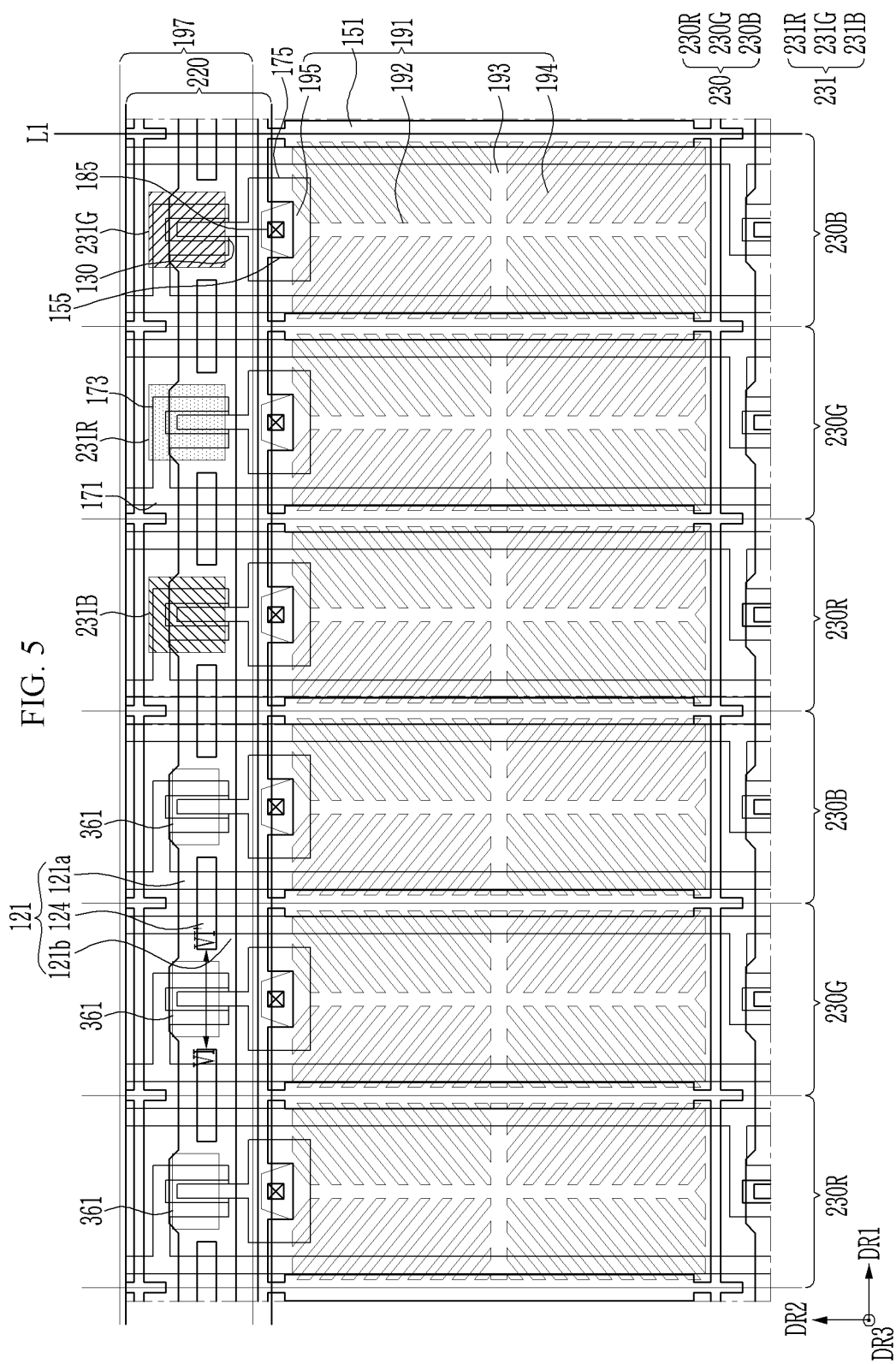
FIG. 5 illustrates six representative pixels located at one side of the boundary line L1 of FIG. 3.

FIG. 5 illustrates six representative pixels located at one side of the boundary line L1 of FIG. 3. Referring to FIG. 5, the measurement patterns 231R, 231G, and 231B are located in a red pixel, a green pixel, and a blue pixel, respectively, that are adjacent to the boundary line L1, but the measurement pattern 231 is not located in pixels that are not adjacent to the boundary line L1.

On the other hand, a sub-column spacer 361 is disposed in pixels where the measurement pattern 231 is not located as shown in FIG. 5. Since the sub-column spacer 361 is not located in the pixel where the measurement pattern 231 is located, the cell gap in the pixel where the measurement pattern 231 is located and the cell cap in the pixel where the measurement pattern 231 is not located may be similarly maintained.

Figure 6:
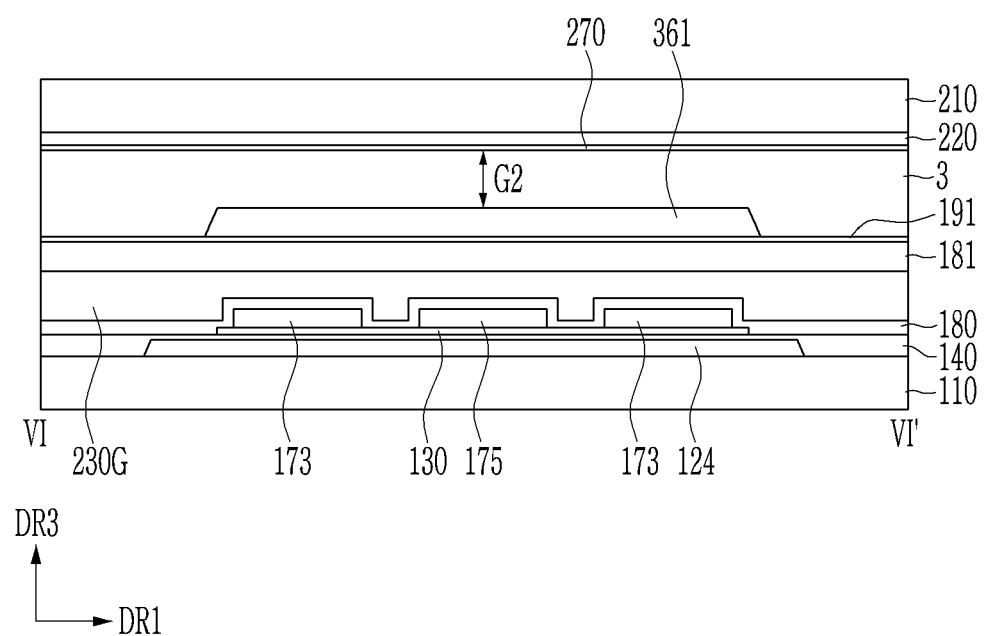
FIG. 6 is a cross-sectional view taken along the line VI-VI' of display device of FIG. 5.

FIG. 6 is a cross-sectional view taken along the line VI-VI' of display device of FIG. 5. Referring to FIG. 6, the sub-column spacer 361 is disposed on the first electrode 191 and overlaps the green color filter 230G. In this case, a cell gap of the liquid crystal layer 3 is shown as G2.

Referring back to FIG. 2, the sub-column spacer 361 is not located in the pixel where the measurement pattern 231 is located. However, since a height of the measurement pattern 231 and a height of the sub-column spacer 361 are similar to each other, the cell gap G1 in FIG. 2 and the cell gap G2 of FIG. 6 are similar to each other. For example, the difference between the cell gap G1 in FIG. 2 and the cell gap G2 in FIG. 6 may be less than 10%. That is the difference in thickness between the measurement pattern 231 and the sub-column spacer 361 may be less than 10%.

That is, the measurement pattern 231 may also serve as the sub-column spacer 361.

Figure 7:
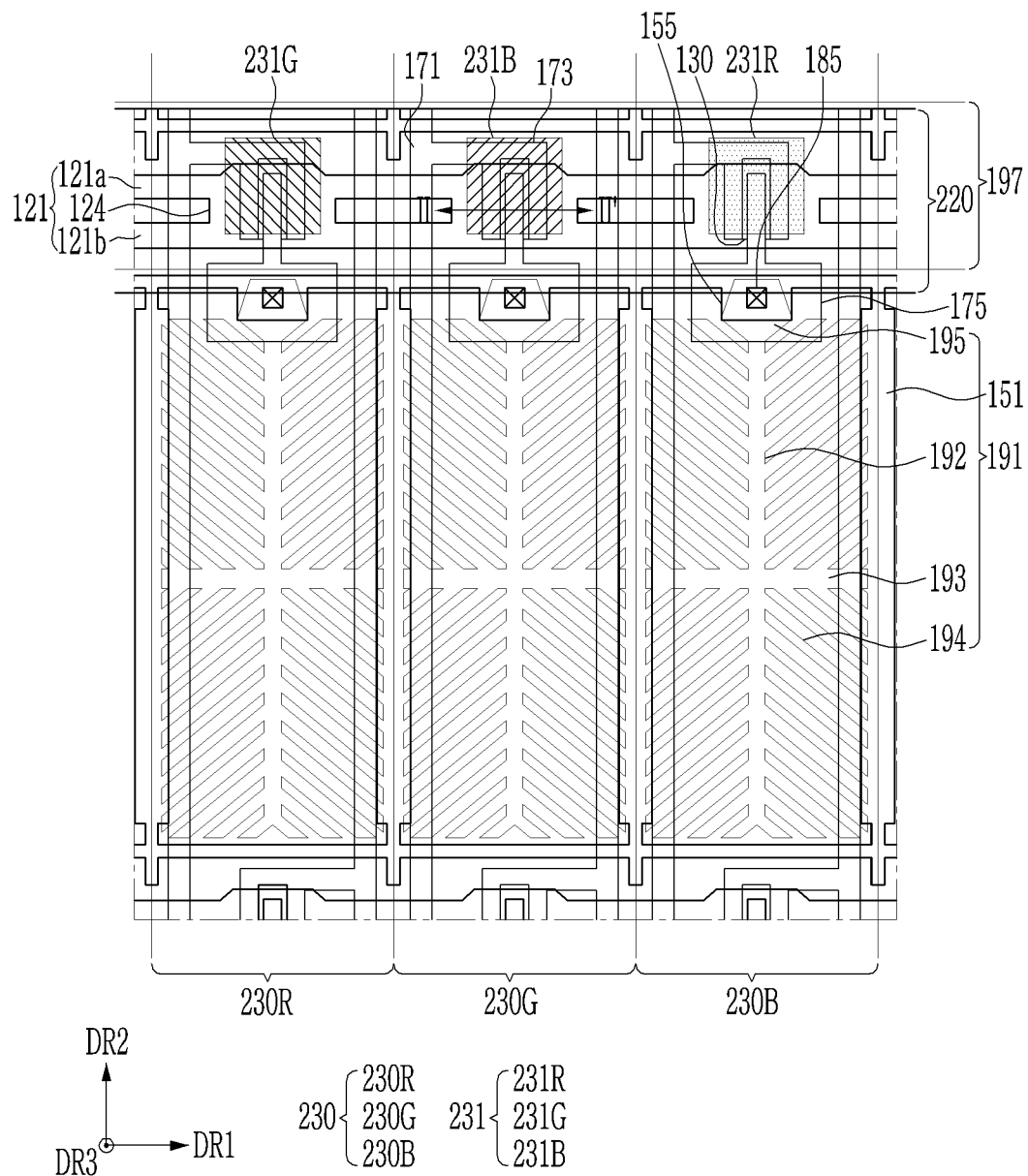
FIG. 7 is a layout view of another exemplary embodiment of a display device constructed according to the principles of the invention.

FIG. 7 is a layout view of another exemplary embodiment of a display device constructed according to the principles of the invention. Referring to FIG. 7, a display device is the same as the exemplary embodiment of FIG. 1, except for a location relationship of a red measurement pattern 231R, a green measurement pattern 231G, and a blue measurement pattern 231B. Detailed descriptions of the same constituent elements are omitted to avoid redundancy.

Referring to FIG. 7, the display device illustrated in FIG. 7 is different from the exemplary embodiment of FIG. 1 in that, in the display device of FIG. 7, a red measurement pattern 231R is located not to overlap a green color filter 230G but to overlap a blue color filter 230B, a green measurement pattern 231G is located not to overlap the blue color filter 230B but to overlap the red color filter 230R, and a blue measurement pattern 231B is located not to overlap the red color filter 230R but to overlap the green color filter 230G.

That is, in the display device of FIG. 7, the red measurement pattern 231R is formed in a blue pixel area when the red color filter 230R is formed, the green measurement pattern 231G is formed in a red pixel area when the green color filter 230G is formed, and the blue measurement pattern 231B is formed in a green pixel area when the blue color filter 230B is formed. In this case, the red measurement pattern 231R is formed below the red color filter 230B, the green measurement pattern 231G is formed above the red color filter 230R, and the blue measurement pattern 231B is formed above the green color filter 230G.

Figure 8:
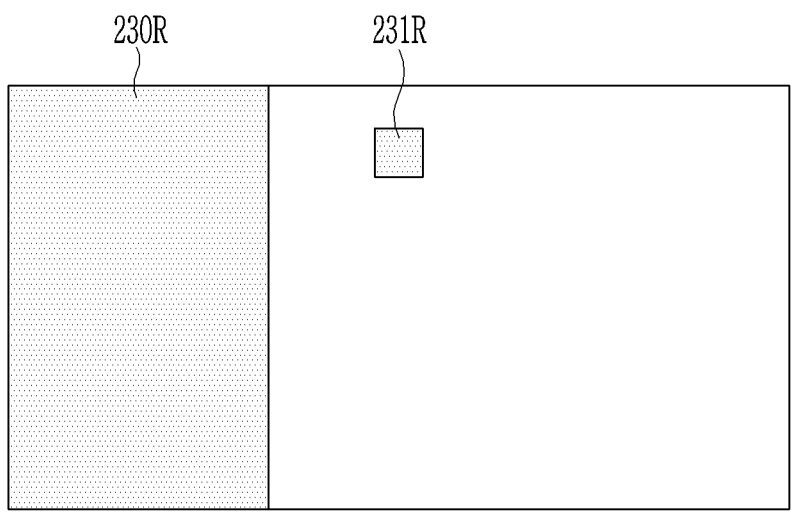
FIGS. 8 to 10 illustrate an exemplary manufacturing process of the display device of FIG. 1 based on configurations of a color filter and a measurement pattern.
Figure 9:
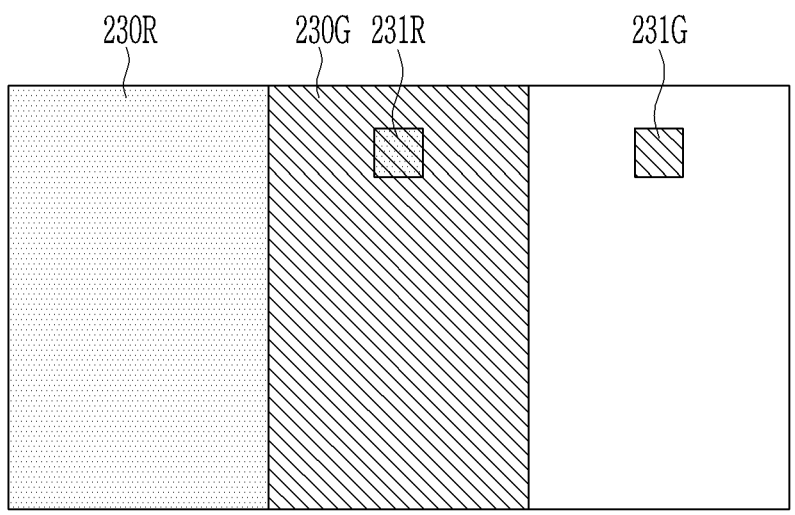
Figure 10:
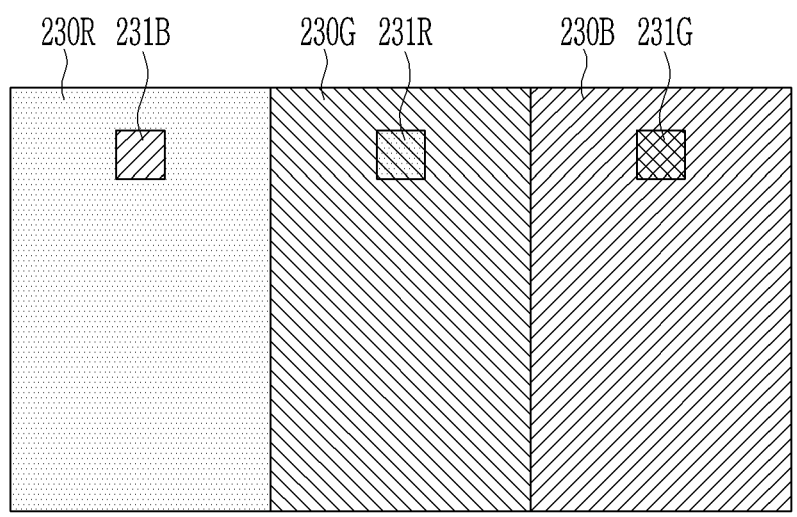

FIG. 8 to FIG. 10 illustrate an exemplary manufacturing process of the display device of FIG. 1 based on the configuration of the color filter 230 and the measurement pattern 231.

Referring to FIG. 8, the red color filter 230R and the red measurement pattern 231R are formed.

Next, referring to FIG. 9, the green color filter 230G and the green measurement pattern 231G are formed. In this case, the green color filter 230G is located overlapping the red measurement pattern 231R.

Next, referring to FIG. 10, the blue color filter 230B and the blue measurement pattern 231B are formed. In this case, the blue color filter 230B is located overlapping the green measurement pattern 231G. The blue measurement pattern 231B is located overlapping the red color filter 230R.

The display device of FIG. 7 may be formed through a process similar to the process of the exemplary embodiment of FIG. 8 to FIG. 10. Since the manufacturing process of the display device of FIG. 7 is the same as the manufacturing process of the exemplary embodiment of FIG. 8 to FIG. 10, a detailed description of the same constituent elements is omitted to avoid redundancy.

As described above, the display device includes a measurement pattern 231 that is formed through the same process as each color filter 230. The measurement pattern 231 is located at a pixel adjacent to the boundary lines L1 and L2 of the masks 700 of the plurality of pixels disposed in the display device, and alignment of the masks 700 can be accurately measured in a process for forming the color filters 230.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate; and
   a plurality of pixels disposed in the first substrate,
   wherein the plurality of pixels include:
   a first pixel including a first color filter having a color and a third measurement indicia overlapping the first color filter, the third measure measurement indicia having a color different from the color of the first color filter,
   a second pixel including a second color filter having a color and a first measurement indicia overlapping the second color filter, the first measure measurement indicia having a color different from the color of the second color filter, and a third pixel including a third color filter having a color and a second measurement indicia overlapping the third color filter, the second measure measurement indicia having a color different from the color of the third color filter, wherein:

the first color filter and the first measurement indicia have substantially the same color, the second color filter and the second measurement indicia have substantially the same color, and the third color filter and the third measurement indicia have substantially the same color.

2. The display device of claim 1, wherein:

the first pixel further includes a first transistor and a first electrode connected with the first transistor, the first electrode of the first pixel overlapping the first color filter;

the second pixel further includes a second transistor and a first electrode connected with the second transistor, the first electrode of the second pixel overlapping the second color filter; and the third pixel further includes a third transistor and a first electrode connected with the third transistor, the first electrode of the third pixel overlapping the third color filter.

3. The display device of claim 1, wherein the first color filter and the first measurement indicia are formed through the same process, the second color filter and the second measurement indicia are formed through the same process, and the third color filter and the third measurement indicia are formed through the same process.

4. The display device of claim 1, wherein the first, second and third measurement indicia comprise first, second and third measurement patterns, respectively, and the color of the first color filter and the first measurement pattern is red, the color of the second color filter and the second measurement pattern is green, and the color of the third color filter and the third measurement pattern is blue.

5. The display device of claim 4, wherein the first substrate comprises n areas partitioned by (n-1) virtual boundary lines, and the first pixel, the second pixel, and the third pixel are located at opposite sides of the virtual boundary lines.

6. The display device of claim 5, wherein the plurality of pixels further comprises a fourth pixel that is not adjacent to the virtual boundary line, the fourth pixel comprises:

a fourth transistor;

a first electrode connected with the fourth transistor;

a color filter overlapping the first electrode connected with the fourth transistor; and a sub-column spacer overlapping the fourth transistor.

7. The display device of claim 6, further comprising:

a second substrate overlapping the first substrate;

a second electrode disposed on the second substrate; and a liquid crystal layer disposed between the first substrate and the second substrate, wherein the liquid crystal layer in the first pixel has a first thickness and the liquid crystal layer in the fourth pixel has a second thickness, and the difference between the first thickness and the second thickness is less than about 10%.

8. The display device of claim 1, wherein the third measurement indicia is disposed on the first color filter, the first measurement indicia is disposed below the second color filter, and the second measurement indicia is disposed below the third color filter.

9. The display device of claim 1, wherein the third measurement indicia is formed in a substantially quadrangular shape.

10. The display device of claim 1, wherein the first pixel comprises a gate line including first and second gate lines spaced apart from each other and a gate electrode connecting to the first and second gate lines; and wherein the third measurement indicia overlaps the gate electrode.

11. A display device comprising:

a first substrate including n areas partitioned by (n-1) virtual boundary lines; and a plurality of pixels disposed on the first substrate, wherein the plurality of pixels comprises a first pixel located adjacent to the virtual boundary line, the first pixel comprises:

a first transistor;

a first electrode connected with the first transistor;

a color filter having a color and overlapping the first electrode connected with the first transistor; and a measurement indicia having a color and overlapping the color filter, wherein the colors of the color filter and the measurement indicia are one of red, green, and blue, and are different from each other, wherein the first pixel comprises a gate line including first and second gate lines spaced apart from each other and a gate electrode connecting to the first gate and second gate lines, and wherein the measurement indicia overlaps the gate electrode.

12. The display device of claim 11, wherein n is a natural number from 2 to 10.

13. The display device of claim 11, wherein the measurement indicia comprises a measurement pattern located on or below the color filter.

14. The display device of claim 11, wherein the measurement indicia has a substantially quadrangular shape.

15. The display device of claim 11, wherein the plurality of pixels further comprises a second pixel that is not adjacent to the virtual boundary line, the second pixel comprises:

a second transistor;

a first electrode connected with the second transistor;

a color filter overlapping the first electrode connected with the second transistor; and a sub-column spacer overlapping the second transistor.

16. The display device of claim 15, wherein the sub-column spacer has a first thickness and the measurement indicia has a second thickness, and the difference between the first thickness and the second thickness is less than about 10%.

17. A display device comprising:

a first substrate; and a plurality of pixels disposed on the first substrate, wherein the plurality of pixels comprise a first pixel, a second pixel, and a third pixel, the first pixel comprises:
a first transistor;
a first electrode connected with the first transistor;
a first color filter overlapping the first electrode connected with the first transistor; and
a second measurement indicia overlapping the first color filter,
the second pixel comprises:
a second transistor;
a second electrode connected with the second transistor;
a second color filter overlapping the second electrode connected with the second transistor; and
a third measurement indicia overlapping the second color filter, and
the third pixel comprises:
a third transistor;
a third electrode connected with the third transistor;
a third color filter overlapping the third electrode connected with the third transistor; and
a first measurement indicia overlapping the third color filter without overlapping the first electrode,
wherein the second measurement indicia does not overlap the second electrode, and the third measurement indicia does not overlap the third electrode.

18. The display device of claim 17, wherein the first, second and third measurement indicia comprise first, second and third measurement patterns, respectively, and
the first color filter and the first measurement pattern are red,
the second color filter and the second measurement pattern are green, and
the third color filter and the third measurement pattern are blue.

19. The display device of claim 17, wherein
the first measurement indicia is located below the third color filter,
the second measurement indicia is located on the first color filter, and
the third measurement indicia is located on the second color filter.

* * * * *